(12) United States Patent
Mayder (10) Patent No.: US 7,768,278 B2
(45) Date of Patent: Aug. 3, 2010

(54) HIGH IMPEDANCE, HIGH PARALLELISM, HIGH TEMPERATURE MEMORY TEST SYSTEM ARCHITECTURE

(75) Inventor: Romi O. Mayder, San Jose, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/689,585

(22) Filed: Mar. 22, 2007

(65) Prior Publication Data

US 2008/0191683 A1 Aug. 14, 2008

Related U.S. Application Data

(60) Provisional application No. 60/889,764, filed on Feb. 14, 2007.

(51) Int. Cl.
  *G01R 31/02* (2006.01)
(52) U.S. Cl. ........................ 324/754; 324/763
(58) Field of Classification Search ......... 324/754–765; 438/14
  See application file for complete search history.

(56) References Cited

U.S. PATENT DOCUMENTS

| | | | | |
|---|---|---|---|---|
| 4,342,958 A * | 8/1982 | Russell | ........................ | 324/754 |
| 4,439,858 A * | 3/1984 | Petersen | ........................ | 714/734 |
| 5,157,325 A * | 10/1992 | Murphy | ........................ | 324/761 |
| 5,337,411 A * | 8/1994 | Harrison, Jr. | ........................ | 709/253 |
| 5,477,160 A * | 12/1995 | Love | ........................ | 324/755 |
| 5,736,850 A * | 4/1998 | Legal | ........................ | 324/158.1 |
| 5,786,615 A | 7/1998 | Saito | | |
| 6,255,844 B1 * | 7/2001 | Kawashima | ........................ | 324/765 |
| 6,374,379 B1 * | 4/2002 | Walker et al. | ........................ | 714/724 |
| 6,380,755 B1 * | 4/2002 | Sato | ........................ | 324/765 |
| 6,462,572 B2 * | 10/2002 | Takahashi | ........................ | 324/755 |
| 6,476,628 B1 * | 11/2002 | LeColst | ........................ | 324/765 |
| 6,496,544 B1 * | 12/2002 | Bethard | ........................ | 375/296 |
| 6,500,699 B1 | 12/2002 | Birdsley et al. | | |
| 6,567,941 B1 * | 5/2003 | Turnquist et al. | ........................ | 714/724 |
| 6,678,850 B2 | 1/2004 | Roy et al. | | |
| 6,853,181 B1 | 2/2005 | Ostertag | | |
| 7,008,092 B2 | 3/2006 | Tanaka et al. | | |
| 7,043,959 B2 * | 5/2006 | Ibane | ........................ | 73/1.42 |
| 7,061,260 B2 * | 6/2006 | Frankowsky et al. | ........................ | 324/756 |
| 7,360,139 B2 * | 4/2008 | Logisch et al. | ........................ | 714/744 |
| 7,649,366 B2 * | 1/2010 | Henson et al. | ........................ | 324/754 |
| 2005/0047037 A1 * | 3/2005 | Litwin et al. | ........................ | 361/56 |
| 2005/0158890 A1 | 7/2005 | Ostertag | | |
| 2005/0265462 A1 * | 12/2005 | Bueti et al. | ........................ | 375/257 |
| 2006/0061374 A1 * | 3/2006 | Shinozaki et al. | ........................ | 324/754 |
| 2006/0118884 A1 | 6/2006 | Losehand et al. | | |

* cited by examiner

*Primary Examiner*—Ha Tran T Nguyen
*Assistant Examiner*—Arleen M Vazquez
(74) *Attorney, Agent, or Firm*—Holland & Hart, LLP (57) ABSTRACT

An electronic device for use with a probe head in automated test equipment. The device includes a plurality of semiconductor devices arranged to provide at least one driver/receiver pair where the driver portion of the driver/receiver pair is configured to transmit a signal to at least one device under test and the receiver portion of the driver/receiver pair is configured to receive a signal from the at least one device under test. Each of the plurality of semiconductor devices is fabricated using either a silicon-on-insulator (SOI) or metal-on-insulator (MOI) technology and has a thickness less than about 300 μm exclusive of any electrical interconnects. The at least one driver/receiver pair is adapted to mount directly to the probe head.

13 Claims, 6 Drawing Sheets

HIGH IMPEDANCE, HIGH PARALLELISM, HIGH TEMPERATURE MEMORY TEST SYSTEM ARCHITECTURE

CROSS-REFERENCE TO RELATED APPLICATION

This application claims priority from U.S. Provisional Patent Application Ser. No. 60/889,764 entitled "High Impedance, High Parallelism, High Temperature Memory Test System Architecture" filed Feb. 14, 2007 which is hereby incorporated by reference in its entirety.

TECHNICAL FIELD

The present invention is related generally to automated test systems; more specifically, the invention is related to driver/receiver-type circuits employed in testing memory and similar high speed electronic devices.

BACKGROUND

Complexity levels of electronic device testing vary tremendously, from simple manual low-volume/low-complexity testing performed with perhaps an oscilloscope and voltmeter, to personal computer-based medium-scale testing, to large-scale/high-complexity automated test equipment (ATE). Manual and personal computer-based testing are typically applied when testing discrete devices, specific components of an integrated circuit, or portions of a printed circuit board. In contrast, ATE testing is used to test functionality of a plurality of complex integrated circuits (ICs) such as memory circuits or hundreds of dice on a wafer prior to sawing and packaging.

Figure 1:
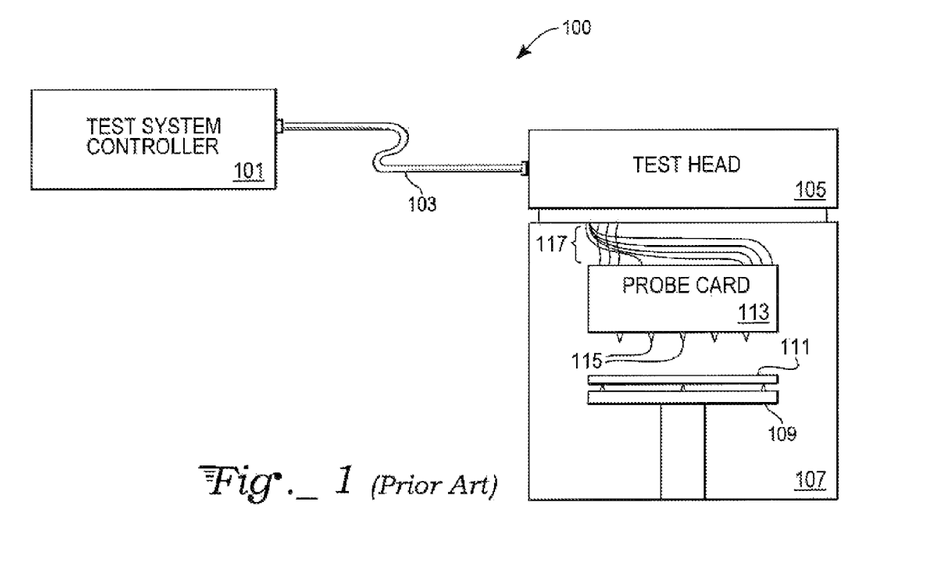
FIG. 1 is a block diagram of an ATE system of the prior art.

FIG. 1 shows a block diagram of an automated test system 100 of the prior art. The test system 100 includes a test system controller 101, a test head 105, and a test prober 107. The test system controller 101 is frequently a microprocessor-based computer and is electrically connected to the test head 105 by a communication cable 103. The test prober 107 includes a stage 109 on which a semiconductor wafer 111 may be mounted and a probe card 113 for testing devices under test (DUTs) on the semiconductor wafer 111. The stage 109 is movable to contact the wafer 111 with a plurality of test probes 115 on the probe card 113. The probe card 113 communicates with the test head 105 through a plurality of channel communications cables 117.

In operation, the test system controller 101 generates test data which are transmitted through the communication cable 103 to the test head 105. The test head in turn transmits the test data to the probe card 113 through the plurality of communications cables 117. The probe card then uses these data to probe DUTs (not shown explicitly) on the wafer 111 through the plurality of test probes 115. Test results are then provided from the DUTs on the wafer 111 back through the probe card 113 to the test head 105 for transmission back to the test system controller 101. Once testing is completed and known good dice are identified, the wafer 111 is diced.

Test data provided from the test system controller 101 are divided into individual test channels provided through the communications cable 103 and separated in the test head 105 so that each channel is carried to a separate one of the plurality of test probes 115. Channels from the test head 105 are linked by the channel communications cables 117 to the probe card 113. The probe card 113 then links each channel to a separate one of the plurality of test probes 115.

Figure 2:
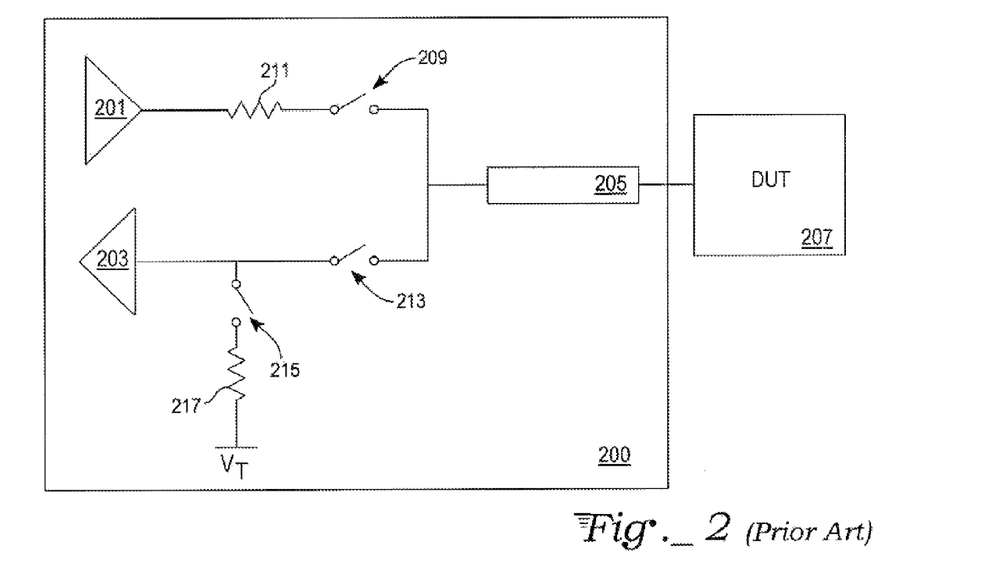
FIG. 2 is a block diagram of a DUT driver/receiver testing apparatus employed in the ATE system of FIG. 1.

With reference to FIG. 2, a prior art tester portion 200 of a typical ATE system designed for high speed testing, such as memory applications, has a driver 201 and comparator 203 pair electrically connected through a transmission line 205 to a single pin on a device under test (DUT) 207. The driver 201 sends write signals to the DUT 207 through a resistive element 211 while the comparator 203 acts as a receiver for reading signals generated by the DUT 207. When the tester portion 200 is writing a signal to the DUT 207, the driver 201 is enabled by closing a write switch 209 and the comparator 203 is disabled by opening a read switch 213. During a read operation, the driver 201 is disabled by opening the write switch 209 and the comparator 203 is enabled by closing the read switch 213.

The physical length of the transmission line 205 is roughly four feet long in a typical ATE test cell used for wafer sort and three feet long in an ATE system used for package test. Since the transmission line 205 is so long, when the tester 200 is reading from the DUT 207, a 50 ohm parallel termination resistor 217 is added into the circuit by closing a termination switch 215. The 50 ohm termination resistor 217 is used to avoid reflections along the transmission line 205.

Figure 3:
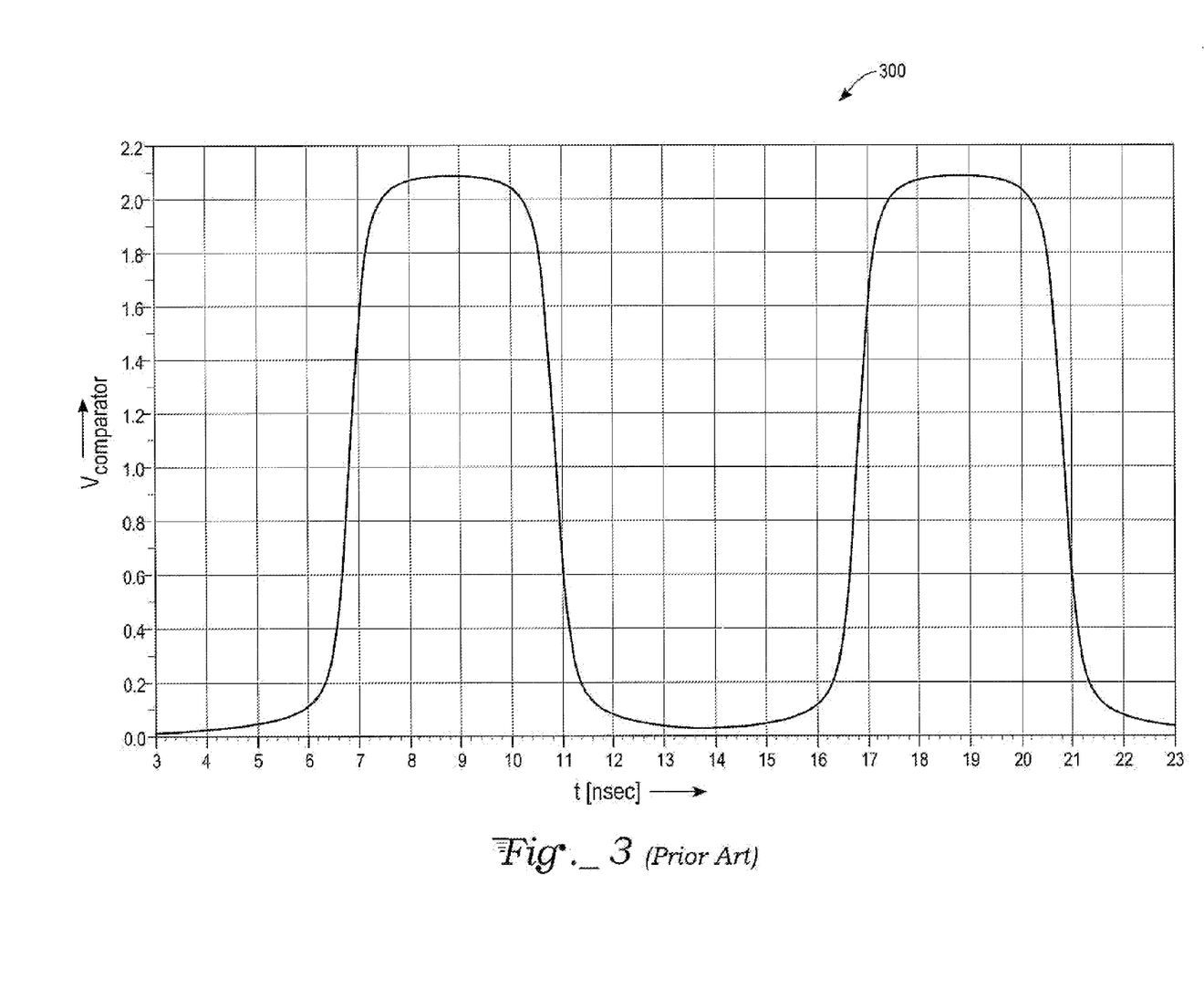
FIG. 3 is a typical prior art reduced-amplitude waveform of a DUT during a read operation using the testing apparatus of FIG. 2 with appropriate parallel termination.
Figure 4:
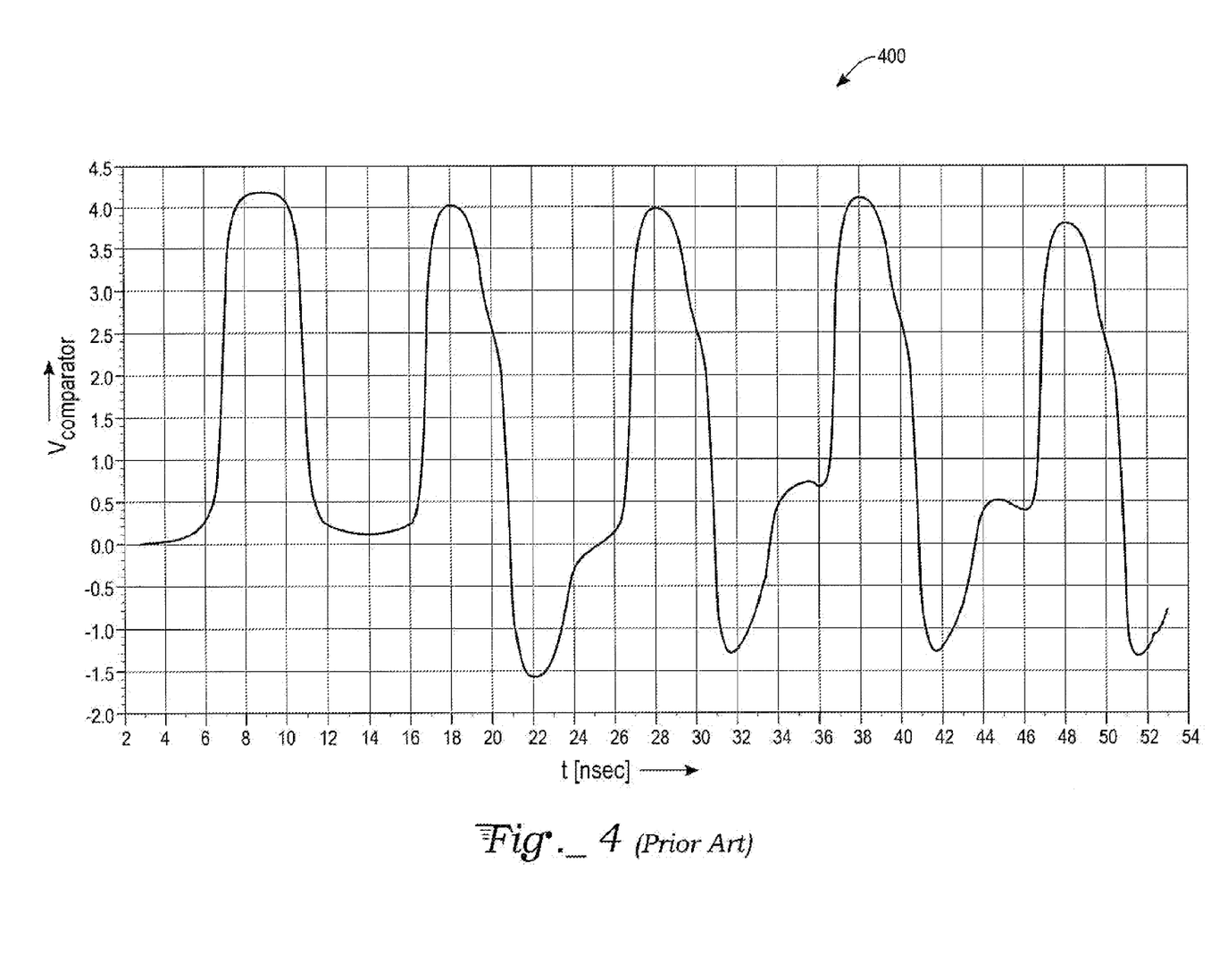
FIG. 4 is a typical prior art waveform of a DUT during a read operating using the testing apparatus of FIG. 2 without parallel termination.

With reference to FIG. 3 and continued reference to FIG. 2, a typical 100 MHz waveform 300 produced by the prior art tester portion 200 is displayed. Closing the termination switch 215 during a read operation reduces an amplitude of the signal received by the comparator 203 to approximately 2.1 V compared with a 3.0 V output from the DUT 207. The amplitude is reduced since the 50 ohm termination resistor 217 creates a voltage divider. If the termination switch 215 is left open, the voltage divider effect is eliminated but reflections on the transmission line 205 produce a distorted waveform 400 (FIG. 4). For comparison, an actual waveform 500 (FIG. 5) emanating from the DUT 207 is shown in FIG. 5.

Figure 5:
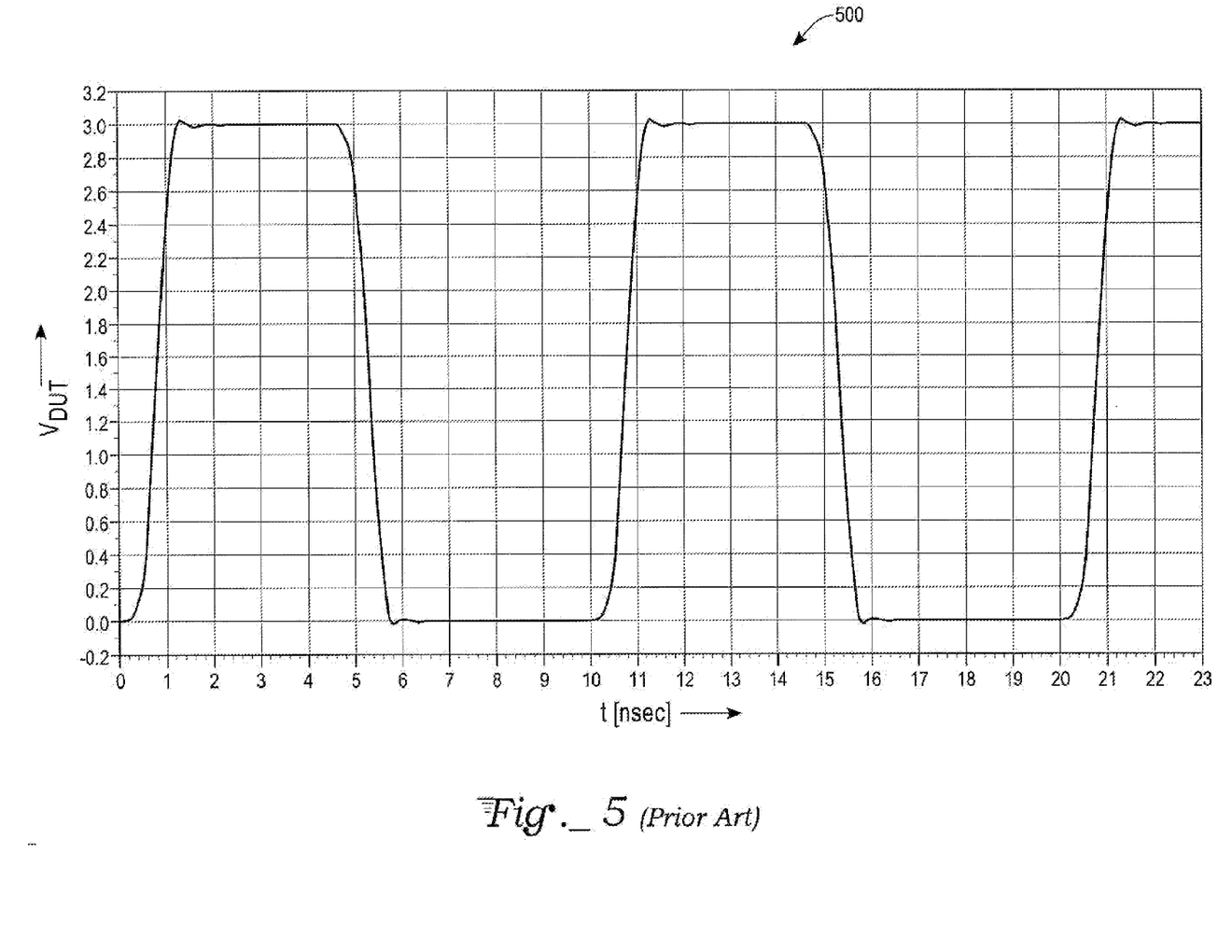
FIG. 5 is a typical prior art waveform originating at and generated by the DUT.

As is readily discernible by one skilled in the art with reference to the waveforms in FIGS. 3-5, to test the DUT 207 with a data rate of greater than 100 MHz during a read cycle, the termination switch 215 must be closed to prevent significant distortion of the read signal. The disadvantage of closing the termination switch 215 is that the DUT 207 must source enough current to drive the 50 ohm termination resistor 217. In today's handheld consumer electronics markets, customers demand several days of usage of their products (such as iPods® and other MP3 devices, cellular phones, digital cameras, etc.) before having to recharge batteries internal to the product. Consequently, more and more memory devices are being designed such that the output buffers conserve power (i.e., battery life). Hence, many memory devices increasingly cannot source the current to drive the 50 ohm termination resistor 217 required during ATE applications. Consequently, a maximum data rate for the testing the DUT 207 cannot be optimized.

For example, a typical memory device inside a contemporary cell phone runs at a frequency of 100 MHz. If the memory device cannot source enough current to drive the 50 ohm termination during ATE testing, the maximum test frequency will be only approximately 10 MHz. Furthermore, most memory devices are intended to be used in applications that do not require a 50 ohm termination since other devices are typically located in close proximity. When the memory device, or any other DUT, sources sufficient current to drive the 50 ohm termination during ATE testing, the electrical characteristics of the device change. Most notably, the 50 ohm termination creates a voltage divider and the DC levels measured at the comparator are attenuated.

One of the key reasons that the driver/receiver pair has been located physically far away from the DUT in prior art applications is due to the wide temperature range over which a DUT is tested. A common temperature test range is from −40° C. to +150° C. The prior art driver/receiver pair typically cannot operate over this large temperature range while maintaining performance specifications. The performance specifications are especially critical for parametric tests such as $I_{CC}$ and other leakage current tests.

Therefore, what is needed is a means to test a large plurality of DUTs in high speed applications while maintaining signal integrity read from the DUTs while ensuring that a full range of temperature testing can still occur.

SUMMARY OF THE INVENTION

In an exemplary embodiment, the invention is an electronic device for use with a probe head in automated test equipment. The device includes a plurality of semiconductor devices arranged to provide at least one driver/receiver pair where the driver portion of the driver/receiver pair is configured to transmit a signal to at least one device under test and the receiver portion of the driver/receiver pair is configured to receive a signal from the at least one device under test. Each of the plurality of semiconductor devices is fabricated using metal-on-insulator technology and has a thickness less than about 300 μm exclusive of any electrical interconnects. The at least one driver/receiver pair is adapted to mount directly to the probe head.

In another exemplary embodiment, the invention is an electronic device for use with a probe head in automated test equipment. The device includes a plurality of semiconductor devices arranged to provide at least one driver/receiver pair where the driver portion of the driver/receiver pair is configured to transmit a signal to at least one device under test and the receiver portion of the driver/receiver pair is configured to receive a signal from the at least one device under test. Each of the plurality of semiconductor devices is fabricated using silicon-on-insulator technology and has a thickness less than about 300 μm exclusive of any electrical interconnects. The at least one driver/receiver pair is adapted to mount directly to the probe head.

In another exemplary embodiment, the invention is an electronic device for use with a probe head in automated test equipment. The device includes a first plurality of semiconductor devices arranged to form at least one driver arranged to couple and transmit a signal to a device under test. A second plurality of semiconductor devices is arranged to form at least one receiver arranged to couple and receive a signal from the device under test. Each of the second plurality of semiconductor devices has a thickness less than about 300 μm exclusive of any electrical interconnects. The at least one receiver is adapted to mount directly to the probe head.

DETAILED DESCRIPTION

In an exemplary embodiment, a driver/receiver pair is fabricated that can be mounted physically close to the DUT, thereby eliminating detrimental effects of the prior art related to long transmission lines and termination networks. Using a metal-on-insulator (MOI) fabrication or silicon-on-insulator (SOI) fabrication process, the MOI-based driver/receiver pair may be fabricated to maintain low leakage currents (e.g., less than 5 nA), even at 150° C., due to a silicon dioxide layer incorporated between a base substrate and an active semiconductor layer.

Figure 6:
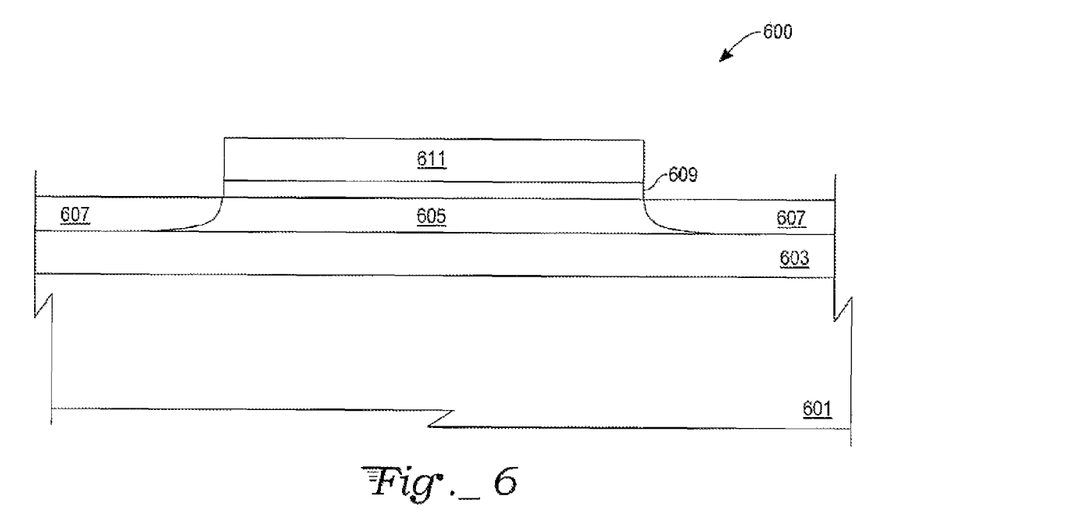
FIG. 6 is an cross-sectional view of an exemplary semiconductor fabrication process used to produce semiconductor-based transconducting devices utilized in the present invention.

In FIG. 6, an exemplary four-terminal FET 600 is fabricated in a metal-on-insulator (MOI) or silicon-on-insulator (SOI) process where an isolated bulk semiconducting material is actively driven by a control signal. The exemplary FET 600 includes a base substrate 601, a first dielectric layer 603, a semiconductor layer 605, a second dielectric layer 609, and a silicided control gate 611. A dopant material is, for example, implanted or diffused into the semiconducting layer 605 to form source and drain regions 607. An electrode (not shown) added in later process steps allows access to the semiconductor layer 605 through a body terminal.

In a specific exemplary embodiment, the semiconducting layer 605 is approximately 2 μm (2000 nm) in thickness and is bonded to the first dielectric layer 603. The base substrate 601 may be a silicon wafer. Alternatively, another elemental group IV semiconductor or compound semiconductor (e.g., Groups III-V or II-VI) may be selected for the base substrate 601. In lightweight applications or flexible circuit applications, such as those employed in a cellular telephone or personal data assistant (PDA), the FET may be formed on a polyethyleneterephthalate (PET) substrate deposited with silicon dioxide and polysilicon followed by an excimer laser annealing (ELA) anneal step. In still other applications, the base substrate 601 may be comprised of a dielectric material directly, such as a quartz photomask, thereby obviating a need for the first dielectric layer 603. In this case, the semiconducting layer 605 may be formed directly over the photomask.

In a case where the base substrate 601 is a semiconductor wafer, the wafer may contain a buried oxide layer (not shown) placed below a polysilicon layer (not shown) to prevent transport of carriers through the underlying bulk semiconducting material. The polysilicon is then treated at an elevated temperature to reform crystalline (i.e., non-amorphous) silicon. In still another embodiment, the base substrate 601 is formed from intrinsic silicon, thereby effectively limiting transport of carriers due to the high resistivity of intrinsic silicon.

If either the substrate 601 or the semiconductor layer 605 is chosen to be comprised of silicon, the second dielectric layer 609 may be a thermally-grown silicon dioxide layer. Alternatively, the second dielectric layer 609 may be a deposited layer, for example, a silicon dioxide, silicon nitride, or oxynitride layer deposited by atomic layer deposition (ALD) or chemical vapor deposition (CVD) techniques. In a specific exemplary embodiment, the second dielectric layer is comprised of silicon dioxide, 100 Å to 500 Å in thickness.

Regardless of the fabrication techniques employed, either deep or shallow trenches (not shown) may be subsequently etched into the semiconducting layer 605 to isolate either adjacent devices or adjacent circuits. Any silicon-containing layers may be etched, for example, with potassium hydroxide (KOH) or tetra-methyl ammonium hydroxide (TMAH). an edge wall angle of the shallow trench formed within the semiconducting layer 605 will depend on several factors such as a crystallographic orientation of the semiconducting layer 605 and the type of etchant employed. The edge wall angle determines, to some extent, how densely transistor may be fabricated and still remain electrically isolated from one another.

Deep trench isolation techniques are frequently employed to isolate device elements laterally. Formation of deep trench isolation can be partially accomplished with low-cost dielectric films. Low-cost dielectric films typically have less desirable electrical characteristics (e.g., dielectric breakdown strength or higher shrinkage values) than a high-quality film. However, a high-quality film is a better choice for filling shallow trench isolation (STI) regions and for producing cap layers over a deep trench fill layer. A skilled artisan can readily envision how either deep or shallow trenches may be beneficial to portions of the present invention described herein.

Figure 7:
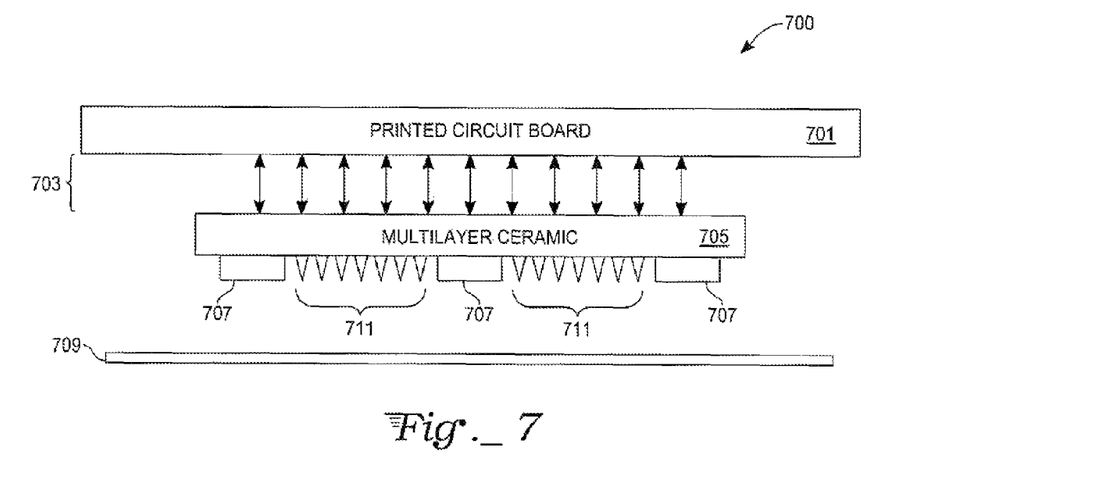
FIG. 7 is a block diagram of an exemplary probe card using transconducting devices fabricated in accord with FIG. 6.

In the case of an ATE wafer sort operation, a bare die fabricated using MOI or SOI fabrication techniques may be soldered directly to a probe head of the probe card. With reference to FIG. 7, an exemplary probe card test arrangement 700 includes a probe printed circuit board (PCB) 701, a multilayer ceramic probe head 705, and a test structure 709 containing a plurality of DUTs (not shown directly). The multilayer ceramic probe head 705 is in electrical communication with the probe PCB 701 through a plurality of electrical interconnects 703. A plurality of probe contact points 711 allows electrical communications with an ATE system (not shown) once the plurality of probe contact points 711 is brought into contact with the test structure 709.

The multilayer ceramic probe head 705 is typically a multilayer low- or high-temperature co-fired ceramic (LTCC or HTCC). Various mounting techniques known in the art may be used for attaching a plurality of MOI-based driver/receiver dice 707 directly to an underside of the multilayer ceramic probe head 705. For example, a series of ball-grid arrays (BGA) solder balls, electroplated bumps, controlled collapse chip connection (C4) bump technology, or other types of bonding features known in the art may be used to electrically and mechanically connect the plurality of MOI-based driver/receiver dice 707 to the multilayer ceramic probe head 705.

Using ordinary fabrication techniques of the prior art, the plurality of MOI-based driver/receiver dice 707 ordinarily cannot be mounted directly to the multilayer ceramic probe head 705 since the plurality of probe contact points is generally too short to allow compression onto the test structure 709. Typically, probe contact points are approximately 750 μm long and require about 100 μm of compression onto a test surface. Thus, any mounted dice must be substantially less than 650 μm in thickness. The 650 μm thickness includes the thickness of any mounting structures, such as C4 columns after collapse. Therefore, the plurality of MOI-based driver/receiver dice 707 are thinned to approximately 300 μm or less exclusive of the mounting structures or electrical interconnects. The MOI-based dice 707 may be thinned by a variety of techniques. In a specific exemplary embodiment, a backside of the base substrate 601 (FIG. 6) containing the MOI-based dice 707 is lapped after device fabrication is completed. Lapping techniques are known in the art.

Another thinning technique involves using a thinned wafer bonded to a thicker base substrate for processing. In a specific exemplary embodiment, a base substrate (not shown) is comprised of five layers prior to device processing. The five layers include, for example, a thick base substrate (e.g., a 750 μm thick silicon wafer), a dielectric bonding layer, a thinned wafer (e.g., a 50 μm thick silicon wafer), an SOI dielectric, and a epitaxial layer upon which the MOI-based dice are produced. Thinned semiconductor wafers (e.g., thinned to 30 μm or less) are commercially available (e.g., Silicon Valley Microelectronics, Inc, Santa Clara, Calif.). Processing may then proceed in accordance with the exemplary method described with relation to FIG. 6. After processing, the thick base substrate is removed from the dielectric bonding layer by de-bonding techniques. Thus, a plurality of thin MOI-based semiconductor devices remains.

In another exemplary embodiment of the invention (not shown), the driver/receiver pair describe with reference to FIG. 7 may be split into multiple functional dice. Thus, driver dice may be placed far from the DUT, for instance, located physically inside the ATE system, and receiver dice remain mounted on the probe head. Advantages of this mounting arrangement include having a much greater density of DUTs tested in parallel as the receiver dice mounted on the probe head are roughly only one-half the size of the driver/receiver combination, thereby allowing more possible connections to more DUTs.

Figure 8:
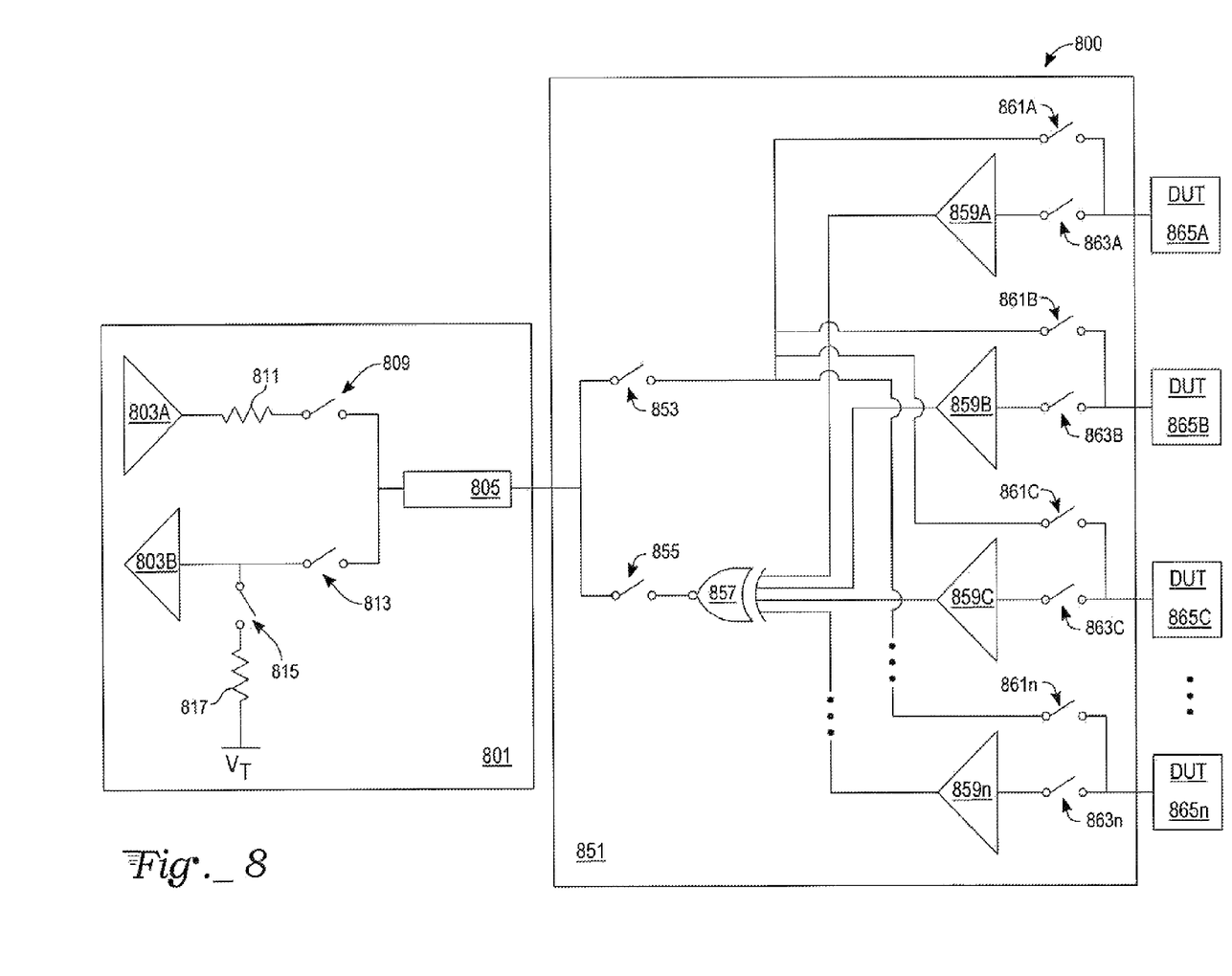
FIG. 8 is a schematic representation of an exemplary embodiment of the present invention replacing a single comparator with multiple comparators.

In yet another exemplary embodiment described with reference to FIG. 8, the single comparator may be replaced by multiple comparators and a logic circuit that will compare expectant data to multiple DUTs simultaneously. The exemplary test arrangement 800 includes an ATE system component 801 and a semiconductor testing component 851. The ATE system component 801 includes a driver 803A and comparator 803B pair electrically connected through a transmission line 805 to the semiconductor testing component 851. The semiconductor testing component 851 may be mounted to the probe head (not shown) to eliminate any deleterious transmission line effects associated with the prior art. Individual components on the semiconductor testing component 851 may be fabricated in accordance with fabrication methods described with reference to FIG. 6. Further, the individual components may be contained on a single die or may be fabricated on a plurality of dice.

The driver 803A sends write signals through a resistive element 811 to the semiconductor testing component 851 while the comparator 803B acts as a receiver for reading signals received from the testing component 851. A value of the resistive element 811 is chosen to match the characteristic impedance of the transmission line. An input impedance to a typical DUT is usually quite high (e.g., greater than 10 megaohms). Consequently, to avoid multiple reflections and standing waves from being created along the transmission line, one reflection is allowed at the DUT and the reflected waveform is terminated at the resistive element 811. When the DUT is driving the ATE (e.g., during a read cycle), the termination element 817 is used to terminate the transmission to avoid reflections.

When the driver 803A is writing a signal to the testing component 851, a signal from the driver 803A is enabled by closing a write switch 809 and any signal passing to the comparator 803 is disabled by opening a read switch 813. During a read operation, the driver 803A is disabled by opening the write switch 809 and closing the read switch 813. The comparator 803 is now enabled to read signals passing from the testing component 851.

The physical length of the transmission line 805 is roughly four feet long in a typical ATE test cell used for wafer sort and three feet long in an ATE system used for package test. When the exemplary test arrangement 800 is configured to read from the testing component 851, a 50 ohm parallel termination element 817, coupled on one end to a termination voltage, $V_T$, is coupled into the circuit by closing a termination switch 815 coupled to the opposite end of the termination element 817. The 50 ohm termination element 815 is used to avoid reflections along the transmission line 805.

The semiconductor testing component 851 includes a write switch 853 and a read switch 855. A plurality of comparators 859A-859n provide input to an exclusive nor (XNOR) gate 857. A plurality of DUTs 865A-865n is coupled to the semiconductor testing component 851 and may be selected for writing or reading operational testing through a series of write switches 861A-861n and a series of read switches 863A-863n, respectively. When one or more of the series of read switches 859A-859n is closed, selected ones of the plurality of DUTs 865A-865n are electrically coupled to associated comparators 859A-859n. Each of the plurality of comparators 859A-859n can source sufficient current to avoid significant amplitude reduction of propagated signals found in the prior art. Alternatively, the XNOR gate 857 can source sufficient current to supply the ATE system component 801 once the read switch 855 is closed.

For a write operation, the write switch 853 and one or more of the series of write switches 861A-861n is closed in order to drive a signal to one or more of the plurality of DUTs 865A-865N. The write signals are transmitted from the driver 803A in the ATE system component through the write switch 809 (in a closed position) and the transmission line 805. In a specific exemplary embodiment, all switches used in the exemplary test arrangement 800 are semiconductor-based transconducting devices (e.g., an FET transistor) which may also be used to passively fan-out signals transferred to or from a plurality of DUTs. The passive fan-out avoids the necessity for an active buffer, thus reducing power dissipation. An additional advantage in not employing an active buffer is that all voltage and timing signals from the plurality of DUTs may be parametrically tested directly (e.g., no analog information will be lost (such as voltage levels and timing) as would be the case with an active buffer arrangement). Also, high DC current fan-outs of 400 mA or more are possible due to the four-terminal technology employed herein.

In the foregoing specification, the present invention has been described with reference to specific embodiments thereof. It will, however, be evident to a skilled artisan that various modifications and changes can be made thereto without departing from the broader spirit and scope of the present invention as set forth in the appended claims. For example, a skilled artisan will recognize that alternative techniques and methods may be utilized to form or deposit certain layers described herein. The alternative techniques and methods are still included within a scope of the appended claims. For example, there are frequently several techniques used for forming a material in addition to CVD deposition or thermal growth techniques (e.g., plasma-enhanced vapor deposition, epitaxy, sputtering etc.). Although not all techniques are amenable to all material types described herein, one skilled in the art will recognize that multiple methods for fabricating a material may be used. Also, various alloys, compounds, and multiple layers of stacked materials may be used, such as with conductive materials formed within the vias. For example, other types of semiconductors may be substituted for an epitaxial layer in the SOI. Additionally, various circuit components and elements produced by fabrication techniques described are exemplary only and illustrative in a functional sense more than a strict component selection sense. A skilled artisan will recognize other circuit elements which may be used instead of or in addition to circuit components described herein.

Additionally, various embodiments described herein describe specific exemplary embodiments of the present invention. In addition to embodiments already described, the present invention has several additional advantages. For example, a read cycle data rate can be optimized for devices that cannot drive 50 ohm terminations or for devices that are intended to be used to drive other devices that are in close physical proximity. Memory and other devices may be tested without using an impedance balancing termination and run at the same frequency that the device would in its intended application These and various other embodiments and techniques are all within a scope of the present invention. The specification and drawings are, accordingly, to be regarded in an illustrative rather than a restrictive sense.

What is claimed is:

1. An electronic device for use with automated test equipment, the device comprising:
   a probe head;
   a plurality of probe contact points extending from a side of the probe head, the plurality of probe contact points extending to a first standoff height (H1) from the side of the probe head;
   a plurality of metal-on-insulator (MOI) semiconductor devices that is i) connected to the side of the probe head from which the plurality of probe contact points extend and ii) has a second standoff height (H2) from the side of the probe head, wherein the standoff height H2 is less than the standoff height H1, wherein the plurality of MOI semiconductor devices provides at least one driver/receiver pair, wherein a driver portion of each driver/receiver pair is configured to transmit a signal to at least one device under test via a respective one of the plurality of probe contact points, and wherein a receiver portion of each driver/receiver pair is configured to receive a signal from the at least one device under test via the at least one of the plurality of probe contact points.

2. The electronic device of claim 1 wherein the plurality of MOI semiconductor devices comprises a plurality of FET-based switches configured to couple the at least one device under test to either the driver portion or the receiver portion of each driver/receiver pair.

3. The electronic device of claim 1 wherein each of the at least one driver/receiver pair is capable of operating in a temperature range of −40° C. to +150° C.

4. The electronic device of claim 1 wherein each of the at least one driver/receiver pair is operational at a frequency of 100 MHz without a termination resistor to ensure integrity of a signal received from the at least one device under test.

5. The electronic device of claim 1 wherein each receiver portion comprises a comparator.

6. The electronic device of claim 1 wherein the at least one device under test is an electronic memory storage device.

7. The electronic device of claim 1 wherein the plurality of probe contact points is compressible, and wherein the first standoff height (H1) is a compressed standoff height of the plurality of probe contact points.

8. An electronic device for use with automated test equipment, the device comprising:
   a probe head;

a plurality of probe contact points extending from a side of the probe head, the plurality of probe contact points extending to a first standoff height (H1) from the side of the probe head;

a plurality of silicon-on-insulator (S0I) semiconductor devices that is i) connected to the side of the probe head from which the plurality of probe contact points extend and ii) has a second standoff height (H2) from the side of the probe head, wherein the standoff height H2 is less than the standoff height H1, wherein the plurality of SOI semiconductor devices provides at least one driver/receiver pair, wherein a driver portion of each driver/receiver pair is configured to transmit a signal to at least one device under test via a respective one of the plurality of probe contact points, and wherein a receiver portion of each driver/receiver pair is configured to receive a signal from the at least one device under test via the at least one of the plurality of probe contact points.

9. The electronic device of claim 8 wherein the plurality of MOI semiconductor devices comprises a plurality of FET-based switches configured to couple the at least one device under test to either the driver portion or the receiver portion of each driver/receiver pair.

10. The electronic device of claim 8 wherein each of the at least one driver/receiver pair is capable of operating in a temperature range of −40° C. to +150° C.

11. The electronic device of claim 8 wherein each of the at least one driver/receiver pair is operational at a frequency of 100 MHz without a termination resistor to ensure integrity of a signal received from the at least one device under test.

12. The electronic device of claim 8 wherein each receiver portion comprises a comparator.

13. The electronic device of claim 8 wherein the plurality of probe contact points is compressible, and wherein the first standoff height (H1) is a compressed standoff height of the plurality of probe contact points.

* * * * *